US010581279B2

(12) United States Patent
Mantese et al.

(10) Patent No.: US 10,581,279 B2
(45) Date of Patent: Mar. 3, 2020

(54) RADIO FREQUENCY AND OPTICAL BASED POWER FOR REMOTE COMPONENT CONDITIONING USING THERMOELECTRICS

(71) Applicant: United Technologies Corporation, Farmington, CT (US)

(72) Inventors: Joseph V. Mantese, Ellington, CT (US); Alan H. Epstein, Lexington, MA (US); Kurt J. Sobanski, Glastonbury, CT (US)

(73) Assignee: United Technologies Corporation, Farmington, CT (US)

( * ) Notice: Subject to any disclaimer, the term of this patent is extended or adjusted under 35 U.S.C. 154(b) by 223 days.

(21) Appl. No.: 15/605,446

(22) Filed: May 25, 2017

(65) Prior Publication Data

US 2018/0342904 A1    Nov. 29, 2018

(51) Int. Cl.
| | |
|---|---|
| H02J 50/20 | (2016.01) |
| F25B 21/04 | (2006.01) |
| H01L 35/28 | (2006.01) |
| H01J 23/40 | (2006.01) |

(52) U.S. Cl.
CPC ............ *H02J 50/20* (2016.02); *F25B 21/04* (2013.01); *H01L 35/28* (2013.01); *F25B 2321/0212* (2013.01); *H01J 23/40* (2013.01)

(58) Field of Classification Search
None
See application file for complete search history.

(56) References Cited

U.S. PATENT DOCUMENTS

| | | | |
|---|---|---|---|
| 3,118,107 A | 1/1964 | Gabor | |
| 7,813,646 B2 | 10/2010 | Furey | |
| 2003/0178615 A1 | 9/2003 | Ato | |
| 2011/0056215 A1* | 3/2011 | Ham | ............... H01F 38/14 62/3.7 |
| 2015/0333799 A1* | 11/2015 | Perry | ............... G10K 11/346 320/108 |

(Continued)

FOREIGN PATENT DOCUMENTS

| | | |
|---|---|---|
| EP | 3148052 | 3/2017 |
| EP | 3327893 | 5/2018 |
| KR | 20170011715 | 2/2017 |

OTHER PUBLICATIONS

European Patent Office, European Search Report dated Oct. 11, 2018 in Application No. 18173526.7-1209.

(Continued)

*Primary Examiner* — Jared Fureman
*Assistant Examiner* — Aqeel H Bukhari
(74) *Attorney, Agent, or Firm* — Snell & Wilmer, L.L.P.

(57) ABSTRACT

A thermoelectric conditioning arrangement may comprise a first antenna/splitter configured to transmit a power & control signal, a second antenna/splitter configured to receive the power & control signal, a waveguide coupled between the first antenna/splitter and the second antenna/splitter, wherein the power & control signal is guided from the first antenna/splitter to the second antenna/splitter via the waveguide, a power converter configured to receive the power & control signal from the second antenna/splitter and generate a direct current (DC) signal, and a thermoelectric cooler (TEC) configured to receive the DC signal from the power converter.

18 Claims, 4 Drawing Sheets

(56) References Cited

U.S. PATENT DOCUMENTS

2017/0042373 A1* 2/2017 Alexander .......... A47J 36/2472

OTHER PUBLICATIONS

Saumil Joshi and Garret Moddel, Efficiency limits of rectenna solar cells : Theory of broadband photon-assisted tunneling Published on Feb. 26, 2013 in the Applied Physics Letter vol. 102, 083901.
European Patent Office, European Search Report dated Jul. 23, 2019 in Application No. 18173526.7.

* cited by examiner

RADIO FREQUENCY AND OPTICAL BASED POWER FOR REMOTE COMPONENT CONDITIONING USING THERMOELECTRICS

FIELD

The present disclosure relates generally to thermoelectric systems, and, more specifically, to systems and methods for powering thermoelectric systems in environments where electrically wired systems are disadvantageous.

BACKGROUND

Thermoelectric coolers (TECs) operate by transporting heat via the motion of electrons and holes. TECs typically receive direct current via wires which extend between the TEC and a power source. However, the wires may enlarge the overall footprint of the system by introducing wiring complexity, increasing interconnect reliability issues and/or possibly limiting where TEC and supported components may be placed. This is especially true in commercial or military aerospace and/or industrial environments where, for example, the placement and addition of wires in a hot section of a component, such as an engine for example, face elevated temperatures.

SUMMARY

A thermoelectric conditioning arrangement is disclosed herein, in accordance with various embodiments. The thermoelectric conditioning arrangement may comprise a first antenna/splitter configured to transmit a power & control signal, a second antenna/splitter configured to receive the power & control signal, a waveguide coupled between the first antenna/splitter and the second antenna/splitter, wherein the power & control signal is guided from the first antenna/splitter to the second antenna/splitter via the waveguide, a power converter configured to receive the power & control signal from the second antenna/splitter and generate a direct current (DC) signal, and a thermoelectric cooler (TEC) configured to receive the DC signal from the power converter.

In various embodiments, the TEC may comprise a hot side and a cold side. The waveguide may comprise a radio frequency (RF) waveguide. The power & control signal may comprise an RF signal. The waveguide may comprise an optical waveguide. The power & control signal may comprise an optical signal. The power & control signal may be sent from the first antenna/splitter to the second antenna/splitter wirelessly.

A thermoelectric conditioning arrangement is disclosed herein, in accordance with various embodiments. The thermoelectric conditioning arrangement may comprise a controller, a first antenna/splitter in electronic communication with the controller and configured to transmit a power & control signal, a second antenna/splitter in electromagnetic communication with the first antenna/splitter and configured to receive the power & control signal, a waveguide configured to guide the power & control signal, a power & control converter configured to receive the power & control signal from the second antenna/splitter and generate a direct current (DC) signal, and a thermoelectric cooler (TEC) configured to receive the DC signal from the power converter.

In various embodiments, the thermoelectric conditioning arrangement may further comprise a device in thermal communication with the TEC. The TEC may be configured to at least one of cool and heat the device to maintain a conditioned temperature. The TEC may comprise a hot side and a cold side that can be switched by changing a direction of a current of the DC signal supplied to the TEC. The device may be mounted to the cold side. The thermoelectric conditioning arrangement may further comprise a temperature sensor configured to measure a temperature of the device. The thermoelectric conditioning arrangement may further comprise a TEC controller, wherein the TEC controller controls the current of the DC signal being supplied to the TEC based on the temperature of the device. At least one of the TEC or the device may be mounted to a component, wherein the component comprises at least one of an engine or an industrial machine. The waveguide may be coupled to the component. The device may be configured to send device data to the controller via the first antenna/splitter and the second antenna/splitter.

A method for powering a thermoelectric cooler (TEC) is disclosed herein, in accordance with various embodiments. The method may comprise receiving, by a second antenna/splitter, a power & control signal from a first antenna/splitter via a waveguide, generating, by a converter, a direct current (DC) signal based on the power & control signal, and receiving, by the TEC, the DC signal. The method may further comprise conditioning, by the TEC, a component. The method may further comprise at least one of cooling or heating, by the TEC, a device.

The forgoing features and elements may be combined in various combinations without exclusivity, unless expressly indicated herein otherwise. These features and elements as well as the operation of the disclosed embodiments will become more apparent in light of the following description and accompanying drawings.

BRIEF DESCRIPTION OF THE DRAWINGS

The subject matter of the present disclosure is particularly pointed out and distinctly claimed in the concluding portion of the specification. A more complete understanding of the present disclosure, however, may best be obtained by referring to the detailed description and claims when considered in connection with the figures, wherein like numerals denote like elements.

DETAILED DESCRIPTION

The detailed description of exemplary embodiments herein makes reference to the accompanying drawings, which show exemplary embodiments by way of illustration.

While these exemplary embodiments are described in sufficient detail to enable those skilled in the art to practice the inventions, it should be understood that other embodiments may be realized and that logical changes and adaptations in design and construction may be made in accordance with this invention and the teachings herein. Thus, the detailed description herein is presented for purposes of illustration only and not of limitation. The scope of the invention is defined by the appended claims. For example, the steps recited in any of the method or process descriptions may be executed in any order and are not necessarily limited to the order presented. Furthermore, any reference to singular includes plural embodiments, and any reference to more than one component or step may include a singular embodiment or step. Also, any reference to attached, fixed, connected or the like may include permanent, removable, temporary, partial, full and/or any other possible attachment option. Additionally, any reference to without contact (or similar phrases) may also include reduced contact or minimal contact. Surface shading lines may be used throughout the figures to denote different parts but not necessarily to denote the same or different materials. In some cases, reference coordinates may be specific to each figure.

As used herein, "electronic communication" means communication of electronic signals with physical coupling (e.g., "electrical communication" or "electrically coupled") or without physical coupling and via an electromagnetic field (e.g., "inductive communication" or "inductively coupled" or "inductive coupling" or "radio frequency" (RF) or "optical"). In that regard, use of the term "electronic communication" includes "electrical communication," including all forms of electromagnetic field communication.

The present disclosure provides a system design based upon the use of radio frequency (RF) and/or optical electromagnetic energy to communicate with and to transmit the power for a thermoelectric cooler (TEC) and a device. Thermoelectric cooling arrangements, as described herein, may reduce total part count, weight, and size by eliminating wires between a controller and a TEC and device. The TEC may be provided to maintain the device within a predetermined range of temperatures. In this regard, the TEC may cool the device and/or tend to minimize cyclic thermal loading on the device. The TEC may also be used to heat the device to reduce thermal cyclic loading With reference to FIG. 1, a thermoelectric conditioning arrangement (also referred to herein as an arrangement) 100 is illustrated, in accordance with various embodiments. Arrangement 100 may include a first antenna or splitter (antenna/splitter) 102, a second antenna/splitter 104, and a waveguide 110. A power signal 106 may be sent from first antenna/splitter 102 to second antenna/splitter 104, via waveguide 110. In this regard, waveguide 110 may be coupled between first antenna/splitter 102 and second antenna/splitter 104. Power signal 106 may be sent from first antenna/splitter 102 to second antenna/splitter 104 wirelessly, but guided by waveguide 110. In this regard, first antenna/splitter 102 and second antenna/splitter 104 may be in radio frequency communication. Alternatively, the energy transmitted from the first antenna/splitter 102 to the second antenna/splitter 104 may be an electromagnetic traveling wave in the light spectrum.

Figure 1:
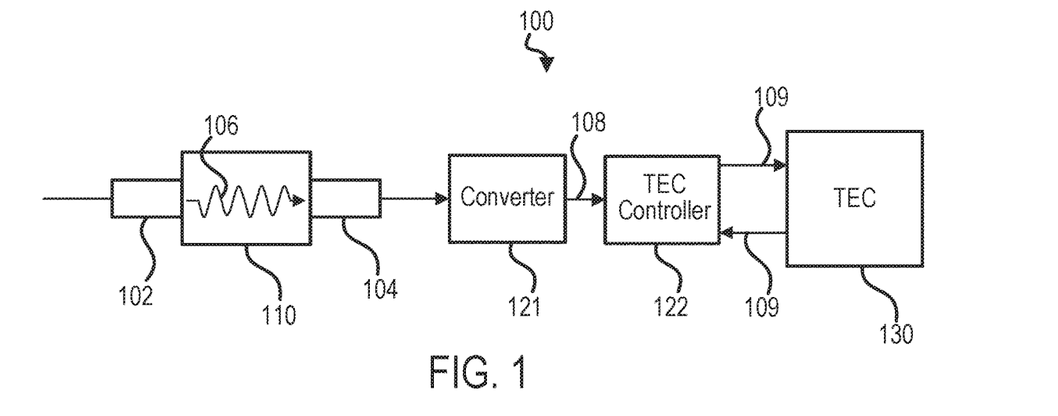
FIG. 1 illustrates a schematic view of a thermoelectric conditioning arrangement, in accordance with various embodiments.

In various embodiments, arrangement 100 may include a power converter (also referred to herein as a converter) 121. Converter 121 may receive power signal 106 via second antenna/splitter 104. Converter 121 may generate a direct current (DC) signal 108. Converter 121 may use power & control signal 106 to generate DC signal 108. In various embodiments, converter 121 may utilize a half-wave rectifier, a full-wave rectifier, or any other converter suitable for rectifying power & control signal 106. In various embodiments, converter 121 may comprise Schottky diodes. In various embodiments, converter 121 may comprise light diodes. DC signal 108 may comprise an electrical current, measured in amperes.

In various embodiments, arrangement 100 may include a TEC 130. TEC 130 may receive DC signal 108 with DC return via conductors 109. TEC 130 may create a heat flux between the junction of two different types of materials. TEC 130 may operate according to the Peltier effect, or the presence of heating or cooling at an electrified junction of two different conductors.

In various embodiments, arrangement 100 may include a TEC controller 122. TEC controller 122 may receive DC signal 108. TEC controller may control DC signal 108 to control the amount of current flowing through TEC 130.

Figure 4:
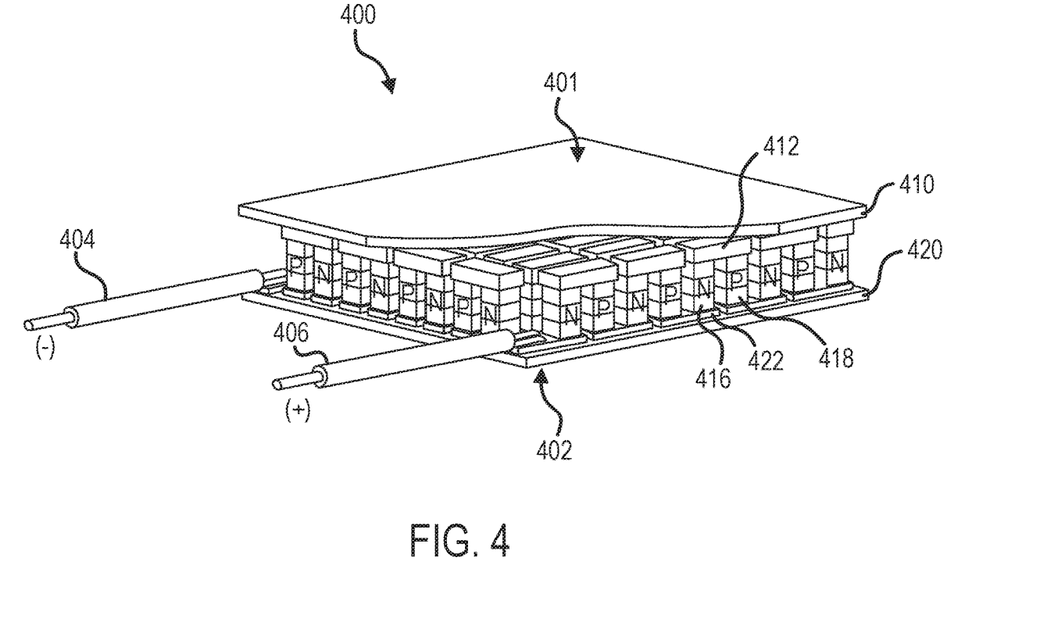
FIG. 4 illustrates a TEC, in accordance with various embodiments.

With additional reference to FIG. 4, an exemplary TEC 400 is illustrated, in accordance with various embodiments. In various embodiments, TEC 400 may serve as TEC 130. TEC 400 may include a first ceramic plate 410 and a second ceramic plate 420. A plurality of n-type and p-type semiconductors (e.g., n-type semiconductor 416 and p-type semiconductor 418, respectively) may be connected electrically in series, and thermally in parallel, between a plurality of metal interconnects (e.g., first interconnect 412 and second interconnect 422). First interconnect 412 may be coupled to, and in thermal communication with, first ceramic plate 410. Second interconnect 422 may be coupled to, and in thermal communication with, second ceramic plate 420. TEC 400 may comprise a cold side 401 and a hot side 402. In this regard, in operation, TEC 400 may remove heat from first ceramic plate 410 to second ceramic plate 420. A first wire 404 and a second wire 406 may be coupled to TEC 400. First wire 404 and second wire 406 may be used to supply current to TEC 400. First wire 404 and second wire 406 may be coupled in series with the plurality of semiconductors.

With reference to FIG. 1, power & control signal 106 may comprise a radio frequency (RF) signal, in accordance with various embodiments. Power & control signal 106 may contain RF waveforms. In this regard, waveguide 110 may comprise an RF waveguide. In various embodiments, waveguide 110 may comprise a metallic conduit, such as a metal tube for example. In this regard, first antenna/splitter 102 may comprise an antenna. In this regard, second antenna/splitter 104 may comprise an antenna.

In various embodiments, power & control signal 106 may comprise an optical signal. Power & control signal 106 may comprise an ultra violet (UV) signal comprising a wavelength of between 10 nanometers and 400 nanometers, visible light from 400 nm to 700 n, a short wave infrared (SWIR) signal comprising a wavelength of between 0.7 micrometers and 3 micrometers, a medium wave infrared (MWIR) signal comprising a wavelength of between 3 micrometers and 5 micrometers, a longwave infrared (LWIR) signal comprising a wavelength of between 8 micrometers and 14 micrometers, visible light, or any other suitable signal for optical communications using a laser diode or similar device. In this regard, waveguide 110 may comprise an optical cable or guide. In this regard, first antenna/splitter 102 may comprise an optical splitter. In this regard, second antenna/splitter 104 may comprise an optical splitter.

Figure 2:
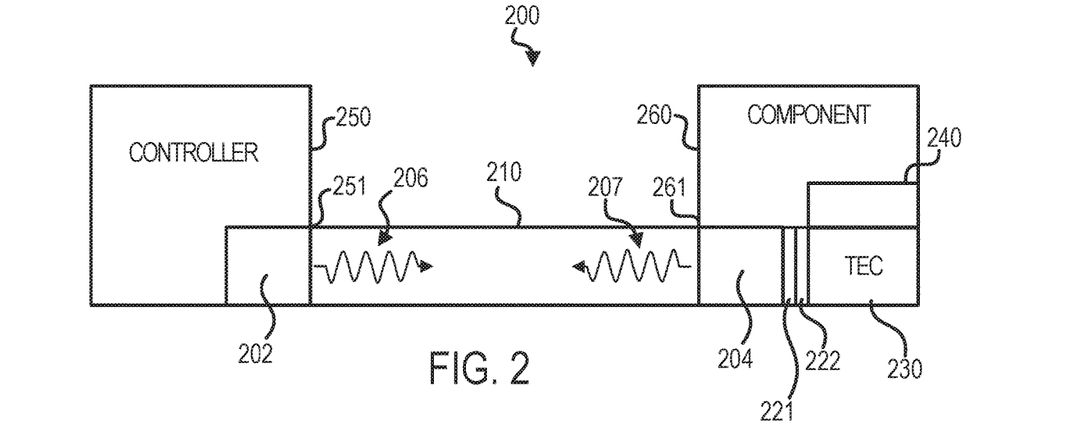
FIG. 2 illustrates a schematic view of a thermoelectric conditioning arrangement, in accordance with various embodiments.

With reference to FIG. 2, a thermoelectric conditioning arrangement (also referred to herein as an arrangement) 200 is illustrated, in accordance with various embodiments.

Arrangement 200 may include a controller 250, a first antenna/splitter 202, a second antenna/splitter 204, a waveguide 210, a converter 221, a TEC controller 222, a TEC 230, and a device 240 to be thermally influenced by the TEC 230. In various embodiments the device 240 may comprise an electronic circuit, a photo-electronic device or any other device required to operate within a controlled temperature range. In various embodiments, first antenna/splitter 202, second antenna/splitter 204, waveguide 210, second antenna/splitter 204, converter 221, TEC controller 222, and TEC 230 may be similar to first antenna/splitter 102, second antenna/splitter 104, waveguide 110, converter 121, TEC controller 122, and TEC 130, respectively, of FIG. 1.

In various embodiments, controller 250 may be in electronic communication with TEC 230 and device 240. Controller 250 may be configured to maintain device 240 under a predetermined temperature. Controller 250 may send power & control signal 206 via first antenna/splitter 202 to second antenna/splitter 204. Power & control signal 206 may be guided by waveguide 210. Waveguide 210 may be coupled between an antenna/splitter housing 251 and an antenna/splitter housing 261. In various embodiments, antenna/splitter housing 251 may be the housing for controller 250. In various embodiments, antenna/splitter housing 261 may be a component 260. Converter 221 may receive power & control signal 206 via second antenna/splitter 204. Converter 221 may use the power & control signal 206 to generate a DC signal for powering TEC 230. Converter 221 may use the power & control signal 206 to generate a DC signal for powering device 240. Device 240 may send a device signal 207 to controller 250 via second antenna/splitter 204. Controller 250 may receive device signal 207 via first antenna/splitter 202. Device signal 207 may comprise data measured by device 240.

In various embodiments, TEC 230 and/or device 240 may be coupled to component 260. In various embodiments, component 260 may comprise any component which is subject to elevated temperatures or which comprises footprints where the inclusion of power leads for the TEC 230 is undesirable. In various embodiments, component 260 may comprise a portion of an engine or an industrial machine. In various embodiments, component 260 may comprise an actuator. In various embodiments, component 260 may comprise an engine case. Component 260 may comprise a metal or metal alloy. Device 240 may be configured to measure a condition of component 260. A "cold" side of TEC 230 may be coupled to device 240 to reduce or increase the temperature of device 240 with respect to component 260.

Figure 3A:
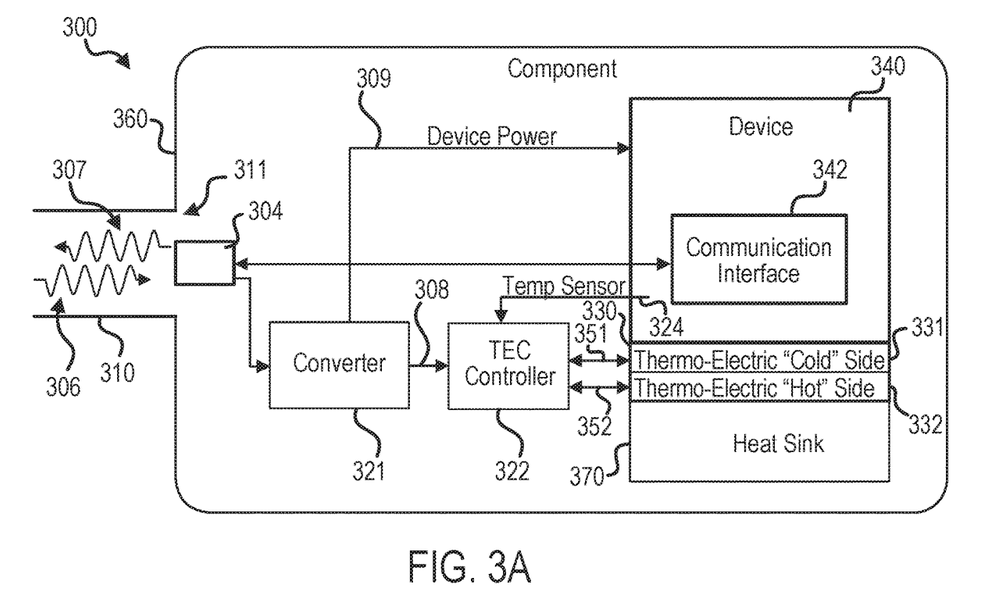
FIG. 3A illustrates a schematic view of a portion of a thermoelectric conditioning arrangement, in accordance with various embodiments.

With reference to FIG. 3A, a thermoelectric conditioning arrangement (arrangement) 300 is illustrated, in accordance with various embodiments. In various embodiments, arrangement 200 of FIG. 2 may be similar to arrangement 300. Arrangement 300 may include a second antenna/splitter 304, a waveguide 310, a converter 321, a TEC controller 322, a TEC 330, and a device 340. In various embodiments, second antenna/splitter 304, waveguide 310, converter 321, TEC controller 322, TEC 330, and device 340 may be similar to second antenna/splitter 204, waveguide 210, converter 221, TEC 230, TEC controller 222, and device 240, respectively, of FIG. 2.

In various embodiments, waveguide 310 may be coupled to component 360. Second antenna/splitter 304 may be coupled to component 360. Second antenna/splitter 304 may be located at an opening 311 of waveguide 310.

In embodiments for RF signals, second antenna 304 may be coupled to converter 321 via a conductor, such as a wire for example, and may be coupled to communication interface 342 via a conductor, such as a wire for example. In embodiments for optical signals, second splitter 304 may be coupled to converter 321 via an optical waveguide, such as an optical cable for example, and may be coupled to communication interface 342 via an optical waveguide, such as an optical cable for example.

A power & control signal 306 may be received by second antenna/splitter 304. Power & control signal 306 may be sent from a first antenna/splitter, such as first antenna/splitter 202 of FIG. 2 for example. Device 340 may receive power & control signal 306. Device 340 may comprise a communication interface 342. Device 340 may receive power & control signal 306 via communication interface 342. Device 340 may send device signal 307 via communication interface 342. In this regard, device 340 may send and receive data via second antenna/splitter 304. In various embodiments, device 340 may measure a position of component 360 and/or a member located adjacent to component 360. For example, component 360 may comprise an actuator and device 340 may act as a sensor and measure a position of component 360 and report said position to controller 250, with momentary reference to FIG. 2. In various embodiments, device 340 may output a position command for a component 360 and/or a member located adjacent to component 360. For example, component 360 may comprise an actuator and device 340 may act as a output device and send pulse width modulated current signals to the actuator of component 360 and report said current to controller 250, with momentary reference to FIG. 2.

Converter 321 may convert power & control signal 306 into a DC signal 308. Converter 321 may be in electronic communication with a TEC controller 322. TEC controller 322 may receive DC signal 308. TEC controller may receive DC signal 308 and control the amount of current flowing through TEC 330 via conductor 351 and conductor 352. TEC 330 may comprise a cold side 331 and a hot side 332. Cold side 331 may be coupled to device 340. In this regard, cold side 331 may be in thermal communication with device 340. In some embodiments, control of the current polarity delivered to the TEC 330 may switch the "hot" and "cold" sides of the TEC 330 to provide heating and/or cooling of device 340. In this regard, TEC 330 may be configured to cool and/or heat device 340 to maintain a conditioned temperature.

Converter 321 may convert power & control signal 306 into a DC signal 309. Device 340 may receive DC signal 309. Device 340 may be powered by DC signal 309.

In various embodiments, arrangement 300 may comprise a temperature sensor 324. Temperature sensor 324 may measure the temperature of device 340. TEC controller 322 may receive a temperature signal from temperature sensor 324. TEC controller 322 may regulate the current supplied to TEC 330 based on the temperature of device 340. In this manner, the temperature of device 340 may be regulated. In various embodiments, temperature sensor 324 may be packaged with device 340 or may be packaged separately from sensor 340. The temperature sensor 324 may be thermally coupled to device 340 when assembled such that accurate temperature measurements may be obtained.

In various embodiments, hot side 332 of TEC may be in thermal communication with a heat sink 370. Heat sink 370 may comprise a medium by which heat is transferred from hot side 332. In various embodiments, heat sink 370 may comprise a metallic member. In various embodiments, heat sink 370 may comprise a fluid such as air, fuel, or water, for example.

Figure 3B:
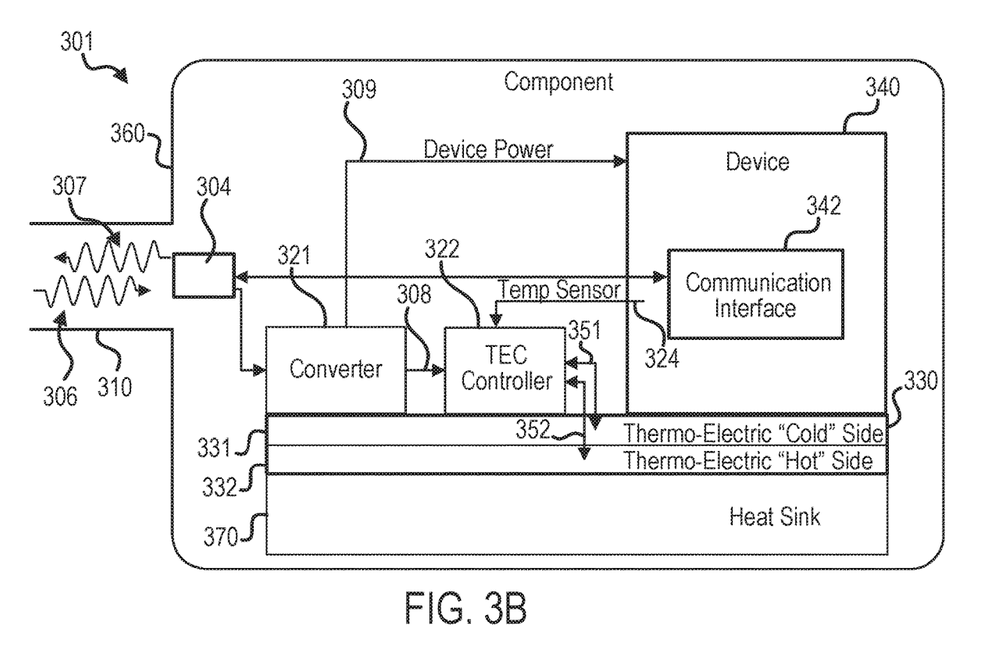
FIG. 3B illustrates a schematic view of a portion of a thermoelectric conditioning arrangement, with a converter in thermal communication with the cold side of a thermoelectric cooler (TEC), in accordance with various embodiments.

With reference to FIG. 3B, converter 321 and TEC controller 322 may be coupled to cold side 331. In this regard, cold side 331 may remove heat from converter 321 and TEC controller 322.

Figure 5:
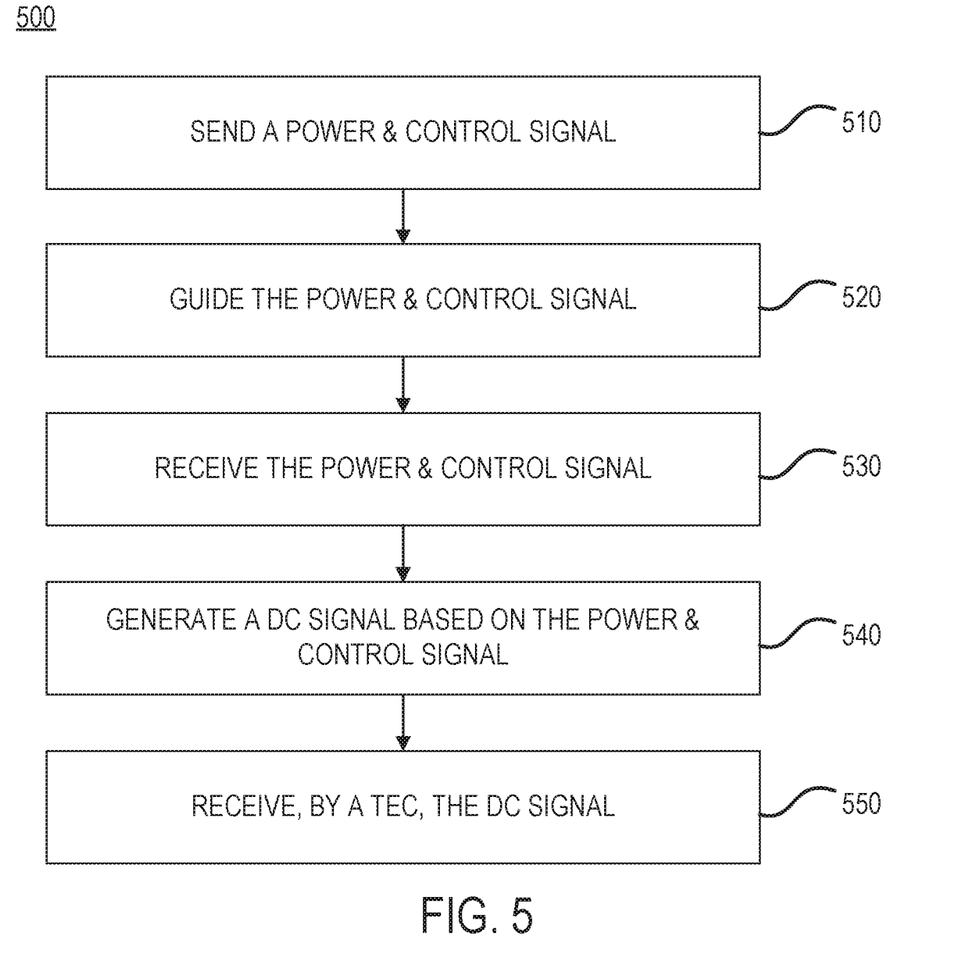
FIG. 5 illustrates a method for powering a TEC, in accordance with various embodiments.

With reference to FIG. 5, a method 500 for powering a TEC is provided, in accordance with various embodiments. Method 500 includes sending a power & control signal (step 510). Method 500 includes guiding the power & control signal (step 520). Method 500 includes receiving the power & control signal (step 530). Method 500 includes generating a DC signal (step 540). Method 500 includes receiving, by a TEC, the DC signal (step 550).

With combined reference to FIG. 2, FIG. 3 and FIG. 5, step 510 may include sending, by first antenna/splitter 202, power & control signal 206. Step 520 may include guiding, by waveguide 210, power & control signal 206. Step 530 may include receiving, by second antenna/splitter 204, power & control signal 206. Step 540 may include generating, by converter 221, DC signal 308 based on power & control signal 306. Step 550 may include receiving, by TEC 330, DC signal 308. DC signal 308 may be received by TEC 330 via TEC controller 322. In various embodiments, TEC 330 may cool device 340. In various embodiments, TEC 330 may heat device 340. Cooling and heating actions may be alternately applied to hold the device 340 within a given temperature range.

Benefits, other advantages, and solutions to problems have been described herein with regard to specific embodiments. Furthermore, the connecting lines shown in the various figures contained herein are intended to represent exemplary functional relationships and/or physical couplings between the various elements. It should be noted that many alternative or additional functional relationships or physical connections may be present in a practical system. However, the benefits, advantages, solutions to problems, and any elements that may cause any benefit, advantage, or solution to occur or become more pronounced are not to be construed as critical, required, or essential features or elements of the inventions. The scope of the inventions is accordingly to be limited by nothing other than the appended claims, in which reference to an element in the singular is not intended to mean "one and only one" unless explicitly so stated, but rather "one or more." Moreover, where a phrase similar to "at least one of A, B, or C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C.

Systems, methods and apparatus are provided herein. In the detailed description herein, references to "various embodiments", "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments.

Furthermore, no element, component, or method step in the present disclosure is intended to be dedicated to the public regardless of whether the element, component, or method step is explicitly recited in the claims. No claim element herein is intended to invoke 35 U.S.C. 112(f) unless the element is expressly recited using the phrase "means for." As used herein, the terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A thermoelectric conditioning arrangement, comprising:
   a first antenna/splitter configured to transmit a power & control signal;
   a second antenna/splitter configured to receive the power & control signal;
   a waveguide coupled between the first antenna/splitter and the second antenna/splitter, wherein the power & control signal is guided from the first antenna/splitter to the second antenna/splitter via the waveguide;
   a power converter configured to receive the power & control signal from the second antenna/splitter and generate a direct current (DC) signal; and
   a thermoelectric cooler (TEC) configured to receive the DC signal from the power converter,
   wherein the TEC is capable of providing heating and cooling to a device.

2. The thermoelectric conditioning arrangement of claim 1, wherein the TEC comprises a hot side and a cold side.

3. The thermoelectric conditioning arrangement of claim 1, wherein the waveguide comprises a radio frequency (RF) waveguide.

4. The thermoelectric conditioning arrangement of claim 3, wherein the power & control signal comprises an RF signal.

5. The thermoelectric conditioning arrangement of claim 1, wherein the waveguide comprises an optical waveguide.

6. The thermoelectric conditioning arrangement of claim 5, wherein the power & control signal comprises an optical signal.

7. The thermoelectric conditioning arrangement of claim 1, wherein the power & control signal is sent from the first antenna/splitter to the second antenna/splitter wirelessly.

8. A thermoelectric conditioning arrangement comprising:
   a controller;
   a first antenna/splitter in electronic communication with the controller and configured to transmit a power & control signal;
   a second antenna/splitter in electromagnetic communication with the first antenna/splitter and configured to receive the power & control signal;
   a waveguide configured to guide the power & control signal;
   a power & control converter configured to receive the power & control signal from the second antenna/splitter and generate a direct current (DC) signal;
   a thermoelectric cooler (TEC) configured to receive the DC signal from the power converter; and
   a device in thermal communication with the TEC;
   wherein the TEC is capable of providing heating and cooling to the device.

9. The thermoelectric conditioning arrangement of claim 8, wherein the TEC is configured to at least one of cool and heat the device to maintain a conditioned temperature.

10. The thermoelectric conditioning arrangement of claim 9, wherein the TEC comprises a hot side and a cold side that can be switched by changing a direction of a current of the DC signal supplied to the TEC.

11. The thermoelectric conditioning arrangement of claim 10, wherein the device is mounted to the cold side.

12. The thermoelectric conditioning arrangement of claim 11, further comprising a temperature sensor configured to measure a temperature of the device.

13. The thermoelectric conditioning arrangement of claim 12, further comprising a TEC controller, wherein the TEC controller controls the current of the DC signal being supplied to the TEC based on the temperature of the device.

14. The thermoelectric conditioning arrangement of claim 11, wherein at least one of the TEC or the device is mounted to a component, wherein the component comprises at least one of an engine or an industrial machine.

15. The thermoelectric conditioning arrangement of claim 14, wherein the waveguide is coupled to the component.

16. The thermoelectric conditioning arrangement of claim 8, wherein the device is configured to send device data to the controller via the first antenna/splitter and the second antenna/splitter.

17. A method for powering a thermoelectric cooler (TEC), comprising:
    receiving, by a second antenna/splitter, a power & control signal from a first antenna/splitter via a waveguide;
    generating, by a converter, a direct current (DC) signal based on the power & control signal; and
    receiving, by the TEC, the DC signal,
    wherein the TEC is capable of providing heating and cooling to a device.

18. The method of claim 17, further comprising at least one of cooling or heating the device, by the TEC, to maintain a conditioned temperature.

* * * * *